United States Patent [19]

Schofield

[11] Patent Number: 5,570,381
[45] Date of Patent: Oct. 29, 1996

[54] SYNCHRONOUS DRAM TESTER

[75] Inventor: Paul Schofield, Kanata, Canada

[73] Assignee: Mosaid Technologies Incorporated, Kanata, Canada

[21] Appl. No.: 430,230

[22] Filed: Apr. 28, 1995

[51] Int. Cl.$^6$ .......................... G11B 27/00; H03M 13/00; H04L 7/00
[52] U.S. Cl. ........................ 371/61; 365/201; 395/550; 371/21.1
[58] Field of Search ................................ 371/61, 62, 21.1; 365/201, 230.03, 233, 200, 189.01; 370/84; 395/280, 880, 550; 360/71, 73.01, 73.08, 31

[56] References Cited

U.S. PATENT DOCUMENTS 5,265,049  11/1993  Takasugi ........................ 365/189.01
5,394,399  2/1995  Kawasaki et al. ........................ 370/84
5,414,816  5/1995  Oyadomari .............................. 395/880
5,495,585  2/1996  Datwyler et al. ........................ 395/280

*Primary Examiner*—Robert W. Beausoliel, Jr.
*Assistant Examiner*—My-Phung Chung
*Attorney, Agent, or Firm*—Pascal & Associates

[57] ABSTRACT

A method of testing synchronous dynamic random access memories (SDRAMs) having a pair of memory banks, comprised of writing data into a first of the pair of memory banks at a first clock speed that can be used by a tester, transferring the data at a second clock speed much higher than the first clock speed from the first of the pair of memory banks to a second of the pair of memory banks, and then reading the second of the pair of memory banks at the first clock speed to the tester.

7 Claims, 5 Drawing Sheets

SYNCHRONOUS DRAM TESTER

FIELD OF THE INVENTION

This invention relates to synchronous dynamic random access memories (SDRAMs), and in particular to methods of testing such memories.

BACKGROUND TO THE INVENTION

Large SDRAMs such as 16 Mbit SDRAMs are typically comprised of two memory banks, which share data output buses, data input buses, and a bidirectional data bus. The input and output buses are coupled to the bidirectional data bus via input and output latches. Each memory bank can be addressed independently.

When testing SDRAMs, testers must be able to write data to and read data from the SDRAMs via the data bus as fast as the SDRAMs are rated, such as with clock speeds of 100 MHz or 200 MHz in some devices. Unfortunately most SDRAM testers have been unable to test SDRAMs at full speed, which makes a manufacturer's guarantee of full data speed specifications unreliable.

SUMMARY OF THE INVENTION

The present invention is a method for testing SDRAMs at full rated speed (or whatever speed is desired), without requiring the SDRAM tester to operate at such speeds; the SDRAM tester can operate at a much slower speed, thus allowing the majority of such testers to be used. Thus the SDRAMs can be tested by the manufacturer to full data sheet specifications, and guarantee operation at such speed with reliability. In addition, no new testers are required, keeping costs of testing to a minimum.

In essence, to test an SDRAM in accordance with an embodiment of the present invention, one memory bank of the SDRAM is loaded at low tester speed with a test pattern. A high speed clock is then applied to the SDRAM (both memory banks), at the required specification test speed. The test pattern is then transferred in a page mode, in one operation, from one memory bank to the other, at the high speed. This can be effected via the common bidirectional data bus. After the transfer, the lower speed clock which operates at the tester speed is reapplied, and the tester reads the data from the second memory bank, determining whether or not it is valid.

In the event that the data is declared as valid by the tester, the high speed clock can be reapplied, and the test pattern from the second memory bank is transferred to the first. The low speed clock is reapplied and the tester reads the test pattern from the first memory bank at its own speed, to determine its validity, and to check that data can be transferred correctly from the second memory bank to the first.

In the event the memory contains more than two memory banks, the test pattern can be transferred from one to many, or from one to any one of the other memory banks at high clock speed, and the data integrity of the test pattern checked by the tester at low clock speed.

In accordance with an embodiment of the present invention, a method of testing an SDRAM having a pair of memory banks is comprised of writing data into a first of the pair of memory banks at a first clock speed that can be used by an SDRAM tester, transferring the data at a second clock speed much higher than the first clock speed from the first of the pair of memory banks to a second of the pair of memory banks, and then reading the second of the pair of memory banks at the first clock speed to the tester.

BRIEF INTRODUCTION TO THE DRAWINGS

A better understanding of the invention will be obtained by reading the description of the invention below, with reference to the following drawings, in which:

FIG. 1 is a block diagram of an SDRAM on which the present invention can be carried out, FIG. 2 is a timing chart illustrating logic levels of various signals used in a read operation of the SDRAM in accordance with the prior art, FIG. 3 is a timing chart illustrating logic levels of various signals used in a write operation of the SDRAM in accordance with the prior art, FIG. 4 is a timing chart illustrating logic level of various signals used in a transfer operation of the SDRAM in accordance with an embodiment of the invention, and FIG. 5 is a flow chart illustrating the basic method of the invention.

DETAILED DESCRIPTION OF THE INVENTION

SDRAMs are described in the publication Micron Design Line, Volume 2, Issue 2, 2nd quarter, 1993, pages 1–5.

Figure 1:
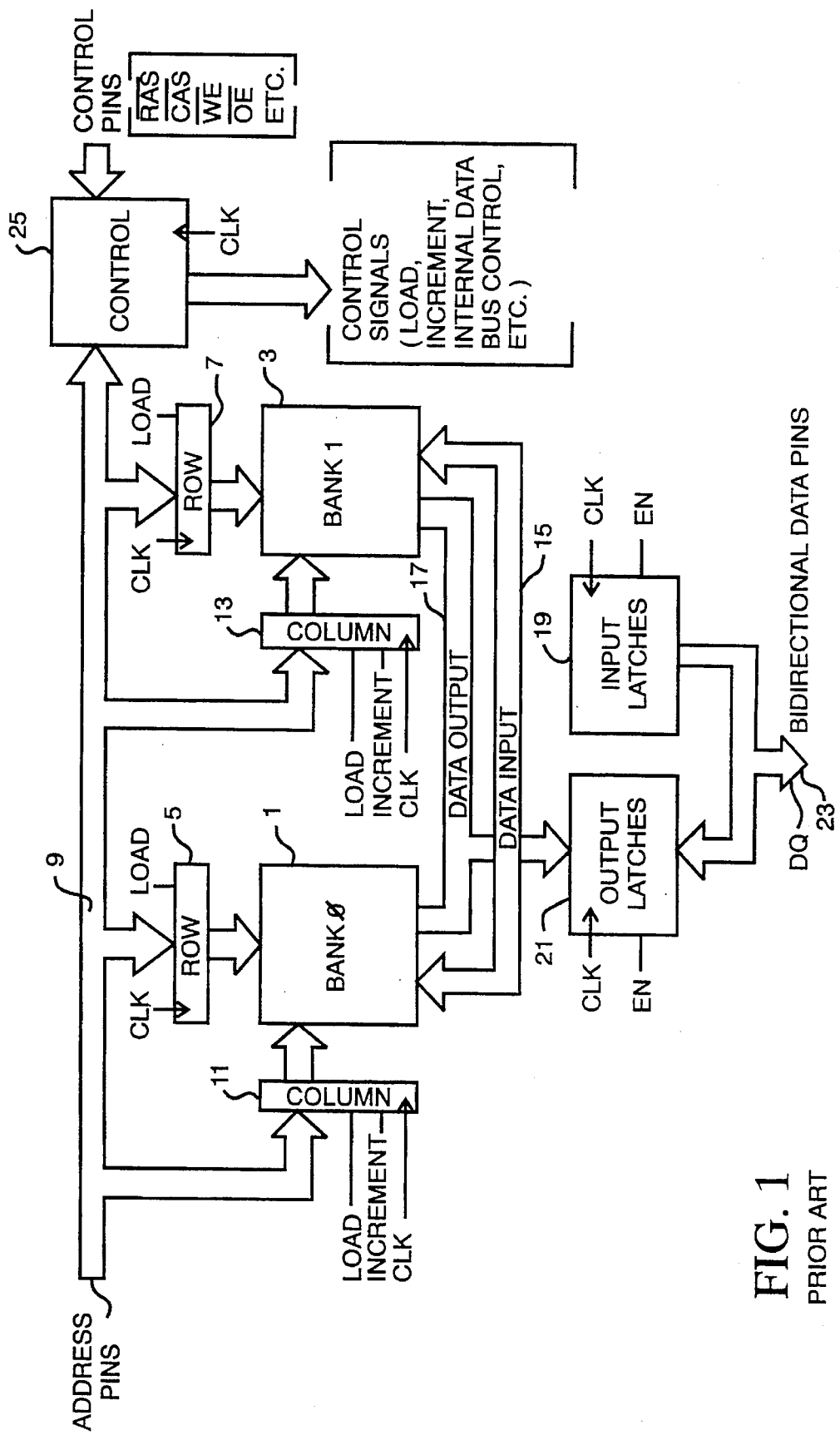

FIG. 1 illustrates a block diagram of an SDRAM. The SDRAM is comprised of first and second memory banks 1 and 3 respectively. Each bank can be addressed independently. Each memory bank has row latches 5 and 7 respectively, connected to an address bus 9, for receiving row addresses a clock signal CLK and a load instruction LOAD. The row address must be valid on the address bus at an appropriate edge of the clock signal.

Each memory bank also has column latches 11 and 13 respectively, which have inputs connected to the address bus 9. The column latch block also has clock CLK and load instruction LOAD inputs, and as well, an increment input to implement burst data operations within a page.

The memory banks share an internal input databus 15 and an internal output databus 17. These databuses drive input 19 and output 21 latches respectively, which have clock CLK and enable EN inputs. A bidirectional bus 23 is connected to the latches 19 and 21.

Control of the memory banks is effected by a controller 25, which interfaces the address bus. The controller contains a mode register, which issues commands and instructs the chip how to configure itself, as described in the aforenoted Micron Design Line article. The mode register compares the state clocked in by the rising edge of a clock pulse to the mode register memory, and the result of what is contained in the memory is used by the mode register to instruct the chip how to respond to subsequent stimuli.

The information stored in the mode register must define program latency and burst length, before an operation can be performed. Program latency defines how may cycles occur after an instruction before the result of the instruction is provided, and burst length defines how may clock cycles are used within which the data is provided.

Figure 2:
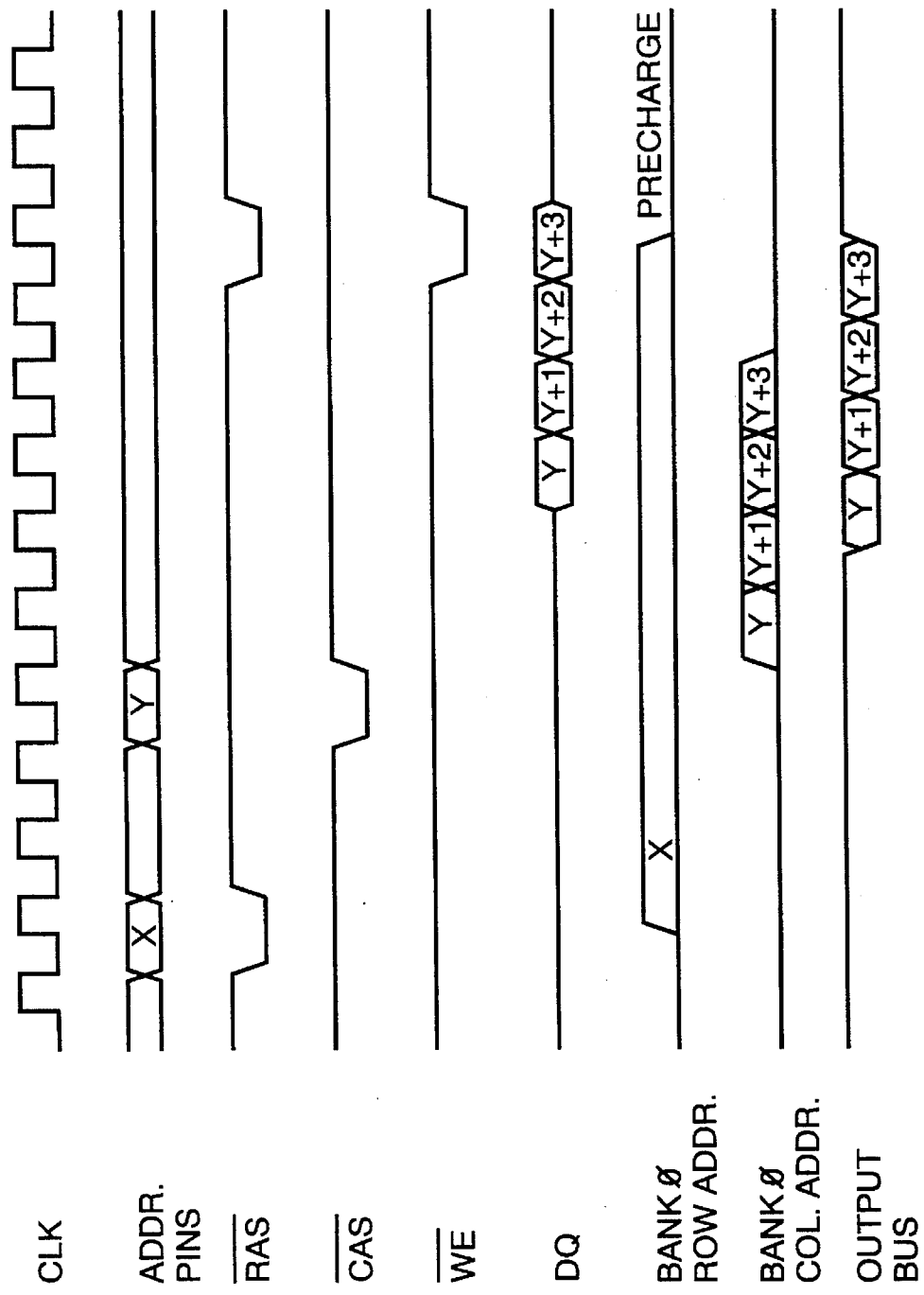

Turning now also to FIG. 2, an example is given wherein a latency of 3 and a burst length of 4 has been programmed into the mode register. A control word is input to the mode register, via the address bus. As a result, the control block generates the control signal to enable register loads, increments, and memory bank read and write operations.

The timing of various signals in an SDRAM read cycle in accordance with the prior art is shown in FIG. 2. /RAS is applied to the mode register along with the row address, which includes the memory bank address as its most significant bit. On the rising edge of the clock CLK wherein/ RAS=0 is sampled, the address is latched into the memory bank row address register, to activate the memory bank.

Several clock cycles later a column address is latched into the chip on a clock edge corresponding to /CAS=0. The memory bank column address register is loaded with this value and a data fetch is initiated. The data corresponding to address Y is available following the next rising clock edge on the internal data output bus 19.

The same rising clock edge increments the column address register to Y+1 to initiate a fetch of the next data.

Data is latched from the internal data output bus 19 into the output latch on the next rising clock edge. Data appears at the DQ pins after some propagation delay.

To terminate the read operation, /RAS and/WE are asserted simultaneously. This resets the row address register and precharges the memory bank for the next operation.

A different column address can be input at any time by asserting /CAS=0, either interrupting the current burst, positioning one burst immediately after the current burst, or leaving the output in tri-state between bursts. In all cases, data corresponding to a particular Y-address is available 3 clock cycles after the address in input, as defined by the stored latency value.

Figure 3:
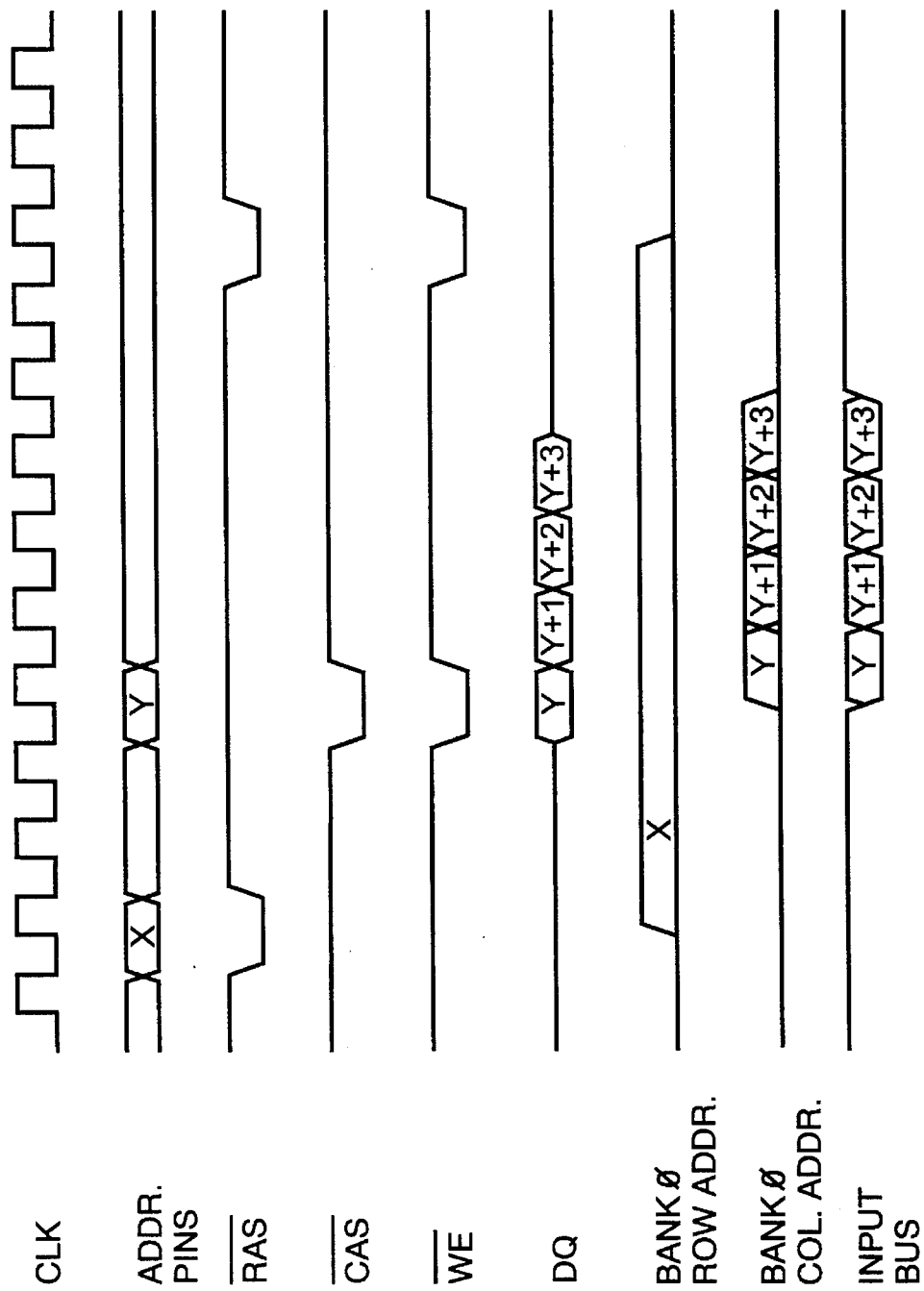

FIG. 3 is a timing diagram of signals in an SDRAM for a write operation, in accordance with the prior art. Input data is provided simultaneously with the starting Y-address.

Figure 4:
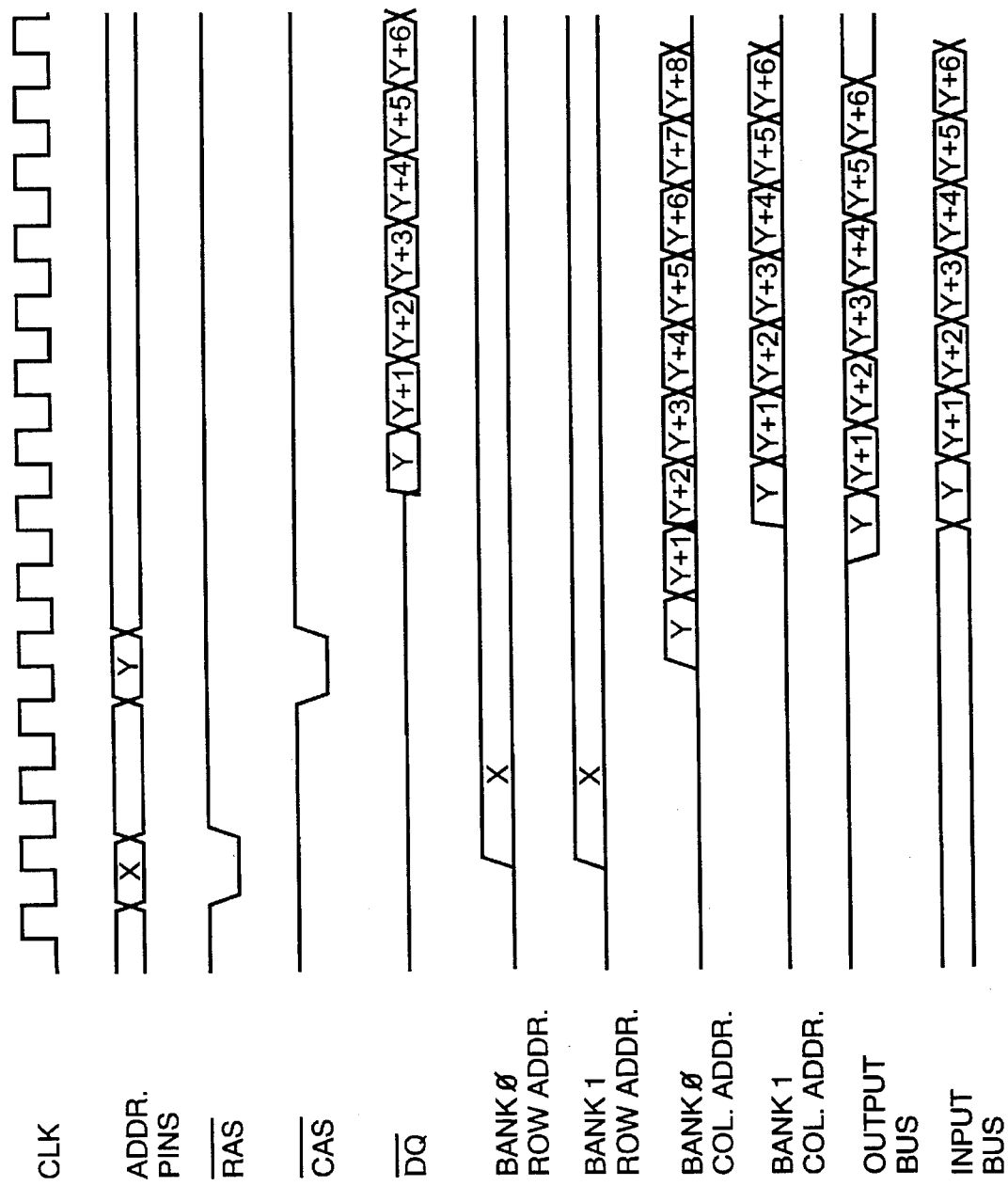
Figure 5:
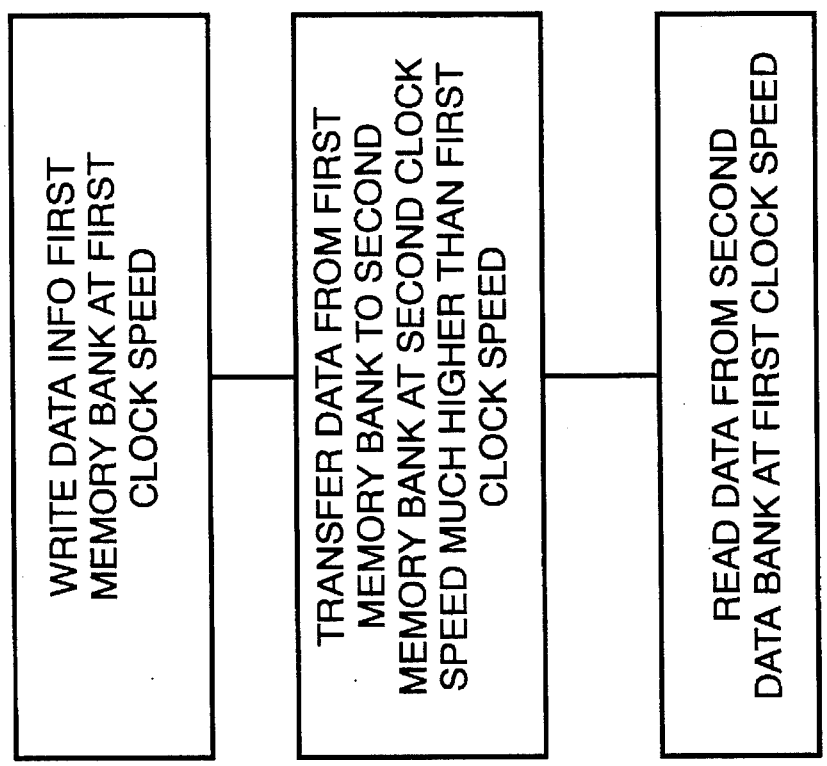

FIG. 4 is a timing diagram of signals in an SDRAM in accordance with the present invention, and FIG. 5 is a flow chart illustrating the basic method of the invention. The control sequence is stored in the memory of the mode register, and requires one memory bank to be in a read mode while the other is in a write mode. At the same time both input and output latches 19 and 21 are enabled at the same time.

Firstly, a tester connected to the bidirectional data bus loads data to the bus at low clock speed. The clock speed is determined by the speed of a master clock connected to the CLK inputs described above. Loading of the data is effected by latching a test pattern from the tester into input latches 19, then addressing one of the memory banks, say first memory bank 1 and applying load, increment and read enable signals so that the data latched in input latches 15 is stored in the memory bank 1.

The clock is then replaced by a high speed clock, one operating at the rate at which the chip is to be tested. A control word is then written to the mode register on the address bus to enable reading from one memory bank and writing to the other memory bank. This is effected by addressing both memory banks, and read enabling memory bank 1 while write enabling memory bank 3. Both the input and output latches are also simultaneously enabled. By appropriately loading the DQ pins, the specification condition can be verified.

The result is that the data stored in memory bank 1 is read to the output latches 21 and is applied to the bidirectional bus 23, and is latched from bus 23 to input latches 19 and is written to memory bank 3, at the rate of the high speed clock.

It is preferred that a full page burst length should be selected, to deliver the contents of memory bank 1 into memory bank 3 in one operation.

After the transfer has been completed, the high speed clock is replaced by a clock having a speed which the tester can handle. The contents of memory bank 3 is then read out to the tester at the lower speed, to check for errors.

It should be noted that once the second memory bank has been loaded with the test pattern from the first, and has been checked as being accurate, that data can be transferred at the high clock speed back to the first, in order to check the data channels in that direction. The initial loading can in that case be dispensed with.

It should also be noted that in the event the memory has more than two memory banks, the test pattern can be transferred at the high clock speed to more than one memory bank at the same time, or one at a time, and each of the memory banks can be checked as noted above by the tester at the lower clock speed. Each of the plural memory banks can then load the first with the test pattern, if its data has been indicated as being valid by the tester.

More sophisticated or complex test sequences based on the techniques described can be effected, for example, by providing for the ability to generate different address access sequences between the two banks, or by manipulating the data as it is transferred between banks, either by logic operation or delay.

A person understanding this invention may now conceive of alternative structures and embodiments or variations of the above. All of those which fall within the scope of the claims appended hereto are considered to be part of the present invention.

I claim:

1. A method of testing an synchronous dynamic random access memory (SDRAM) having a pair of memory banks, comprising writing data into a first of the pair of memory banks at a first clock speed that can be used by a tester, transferring said data at a second clock speed much higher than the first clock speed from the first of the pair of memory banks to a second of the pair of memory banks, and then reading data from the second of the pair of memory banks at the first clock speed to the tester.

2. A method as defined in claim 1 in which the data written into the first of the pair of memory banks is a test pattern, and said step of transferring said data is done at a clock speed which is higher than a clock speed used to read the test pattern to the tester.

3. A method as defined in claim 2 in which said higher clock speed is a design rated speed of the SDRAM.

4. A method as defined in claim 2 including input bus and an output bus both accessible by said pair of memory banks, and a bidirectional bus, in which the output bus is coupled to the data bus via plural output latches, and the input bus is coupled to the data bus via plural input latches, the transferring step including enabling both the input and output latches simultaneously while the first memory bank is in a read mode and the second memory bank is in a write mode.

5. A method as defined in claim 4 in which the transferring step is conducted by placing both the first and second memory banks in a full page burst length mode whereby the entire contents of the first memory bank is transferred to the second memory bank in one operation.

6. A method as defined in claim 1 including an input bus and an output bus both accessible by said pair of memory banks, and a bidirectional bus, in which the output bus is coupled to the data bus via plural output latches, and the input bus is coupled to the data bus via plural input latches, the transferring step including enabling both the input and output latches simultaneously while the first memory bank is in a read mode and the second memory bank is in a write mode.

7. A method as defined in claim 1 in which the transferring step is conducted by placing both the first and second memory banks in a full page burst length mode whereby the entire contents of the first memory bank is transferred to the second memory bank in one operation.

* * * * *